(12) United States Patent
Johnson

(10) Patent No.: US 10,498,306 B1
(45) Date of Patent: Dec. 3, 2019

(54) INTELLIGENT POWER REDUCTION IN AUDIO AMPLIFIERS

(71) Applicant: Roku, Inc., Los Gatos, CA (US)

(72) Inventor: Neil Edward Johnson, Cambridge (GB)

(73) Assignee: ROKU, INC., Los Gatos, CA (US)

( * ) Notice: Subject to any disclaimer, the term of this patent is extended or adjusted under 35 U.S.C. 154(b) by 0 days.

(21) Appl. No.: 16/025,376

(22) Filed: Jul. 2, 2018

(51) Int. Cl.
*H03G 7/06* (2006.01)
*H03F 1/02* (2006.01)
*H03F 3/183* (2006.01)
*H03F 3/217* (2006.01)

(52) U.S. Cl.
CPC ............. *H03G 7/06* (2013.01); *H03F 1/0216* (2013.01); *H03F 3/183* (2013.01); *H03F 3/217* (2013.01); *H03F 2200/03* (2013.01)

(58) Field of Classification Search
None
See application file for complete search history.

(56) References Cited

U.S. PATENT DOCUMENTS

| | | | |
|---|---|---|---|
| 8,995,691 B2 * | 3/2015 | French | H03F 1/0227 381/120 |
| 9,755,605 B1 * | 9/2017 | Li | H03G 3/02 |
| 2007/0164814 A1 * | 7/2007 | Wendt | H03F 1/0227 330/10 |
| 2008/0130906 A1 * | 6/2008 | Goldstein | A61B 5/121 381/58 |
| 2009/0220110 A1 * | 9/2009 | Bazarjani | H03F 1/0211 381/120 |
| 2016/0072445 A1 * | 3/2016 | Tsutsui | H03F 1/0211 330/296 |
| 2018/0011527 A1 * | 1/2018 | Kim | G06F 3/0614 |

* cited by examiner

Primary Examiner — Qin Zhu
(74) Attorney, Agent, or Firm — Sterne, Kessler, Goldstein & Fox P.L.L.C.

(57) ABSTRACT

Disclosed herein is a device and method for intelligently reducing power consumption in an audio amplifier in the device, and in particular Class-D amplifiers, through the use of metadata associated with settings of the playback device and/or content to be played on the playback device. The device includes components for analyzing the settings and content metadata and regulates the voltage provided to the audio amplifier based on this analysis.

18 Claims, 5 Drawing Sheets

INTELLIGENT POWER REDUCTION IN AUDIO AMPLIFIERS

FIELD

This disclosure is generally directed to intelligently reducing power consumption in audio amplifiers in a playback device, and in particular Class-D amplifiers, through the use of metadata associated with settings of the playback device and/or content to be played on the playback device.

BACKGROUND

Audio amplifiers, such as Class-D amplifiers, have a supply voltage for internal control circuits of the amplifier and a separate power supply input for the output of the amplifier. Such amplifiers suffer from inefficiencies caused by power dissipation which can be represented by the formula $P=FNCV^2$, where P represents power dissipated, F represents frequency, N represents the number of transistors, C represents capacitance, and V represents the voltage. As exemplified by this formula, reducing the voltage to the amplifier would exponentially reduce the amount of power dissipated which in turn would increase the amplifier's efficiency.

But reducing voltage supplied to the amplifier necessarily reduces the performance of the amplifier since the amount of power provided to the amplifier is correspondingly reduced. Merely indiscriminately reducing the voltage without consideration of other factors associated with a playback device in which the amplifier is implemented and/or the content being played would significantly degrade the user experience while content is output through the amplifier.

SUMMARY

Provided herein are system, apparatus, method and/or computer program product embodiments, and/or combinations and sub-combinations thereof, for using technology in innovative ways to provide enhanced power regulation of an audio amplifier. An embodiment is directed to system, apparatus, method and/or computer program product embodiments, and/or combinations and sub-combinations thereof, for intelligently generating a voltage signal based on metadata associated with a playback device having an amplifier and the content to be played on the playback device. In a non-limiting embodiment, the apparatus is a playback device that includes a media processor and a memory having voltage control code stored therein. When the playback device executes the code, the media processor generates a voltage control signal. In an embodiment, the playback device includes an amplifier, such as a Class-D amplifier and a voltage regulator in communication with the amplifier, that regulates voltage provided to the amplifier. The playback device also includes a volume control unit that provides settings metadata associated with a user volume setting of the playback device, and a content source configured to provide content metadata associated with content to be output by the amplifier.

Another embodiment is directed to system, apparatus, method and/or computer program product embodiments, and/or combinations and sub-combinations thereof, for granularly generating a voltage control signal based on metadata. In a non-limiting embodiment, the method includes receiving, by a media processor of a playback device, the settings metadata from a volume control unit, and generating, based on the settings metadata, a voltage control signal. The method also includes adjusting, based on the voltage control signal, a voltage level that is provided to an amplifier of the playback device, wherein the voltage control signal indicates the voltage level from a number of predefined voltage levels.

BRIEF DESCRIPTION OF THE FIGURES

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Approaches to solve the power dissipation issue in amplifiers often rely on analysis of an audio signal of the content to be played. This analysis determines the audio amplitude of the content from which the supply voltage can be reduced or increased. However, this approach requires a tradeoff between performance of the amplifier with the quality of the playback of the content because of the potentially unpredictable changes in the audio signal. Strict fidelity between the voltage supplied and the audio signal may result in "pumping" the amplifier (i.e., rapid increases and decreases in volume level) and causing audible artifacts during playback. Loosening the fidelity between the voltage and the audio signal would result in losing the benefits of a voltage control scheme.

Some schemes attempt to avoid such artifacts by introducing a delay in the audio pipeline so as to provide a "look-ahead" of the audio signal. But this approach raises additional issues especially for combined audio-video systems where synchronization between the audio and the video must be tightly controlled to enhance the user experience.

Figure 1:
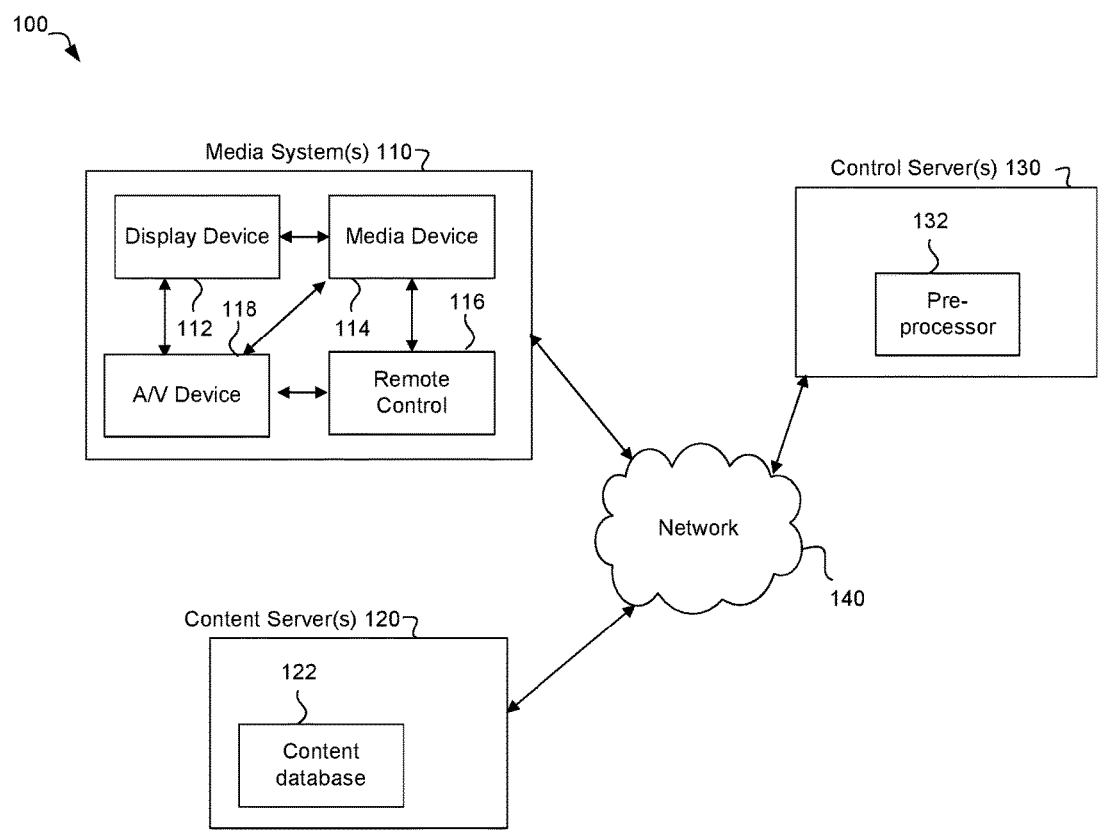
FIG. 1 illustrates a block diagram of a multimedia environment that includes one or more media systems, one or more content servers, and one or more control servers, according to some embodiments.

FIG. 1 illustrates a block diagram of a multimedia environment 100, according to some embodiments. In a non-limiting example, multimedia environment 100 is directed to playing content, such as video content (having associated audio) and/or audio content, on a media system 110. The content may be stored locally in a device in media system 110 and/or streamed over network 140 from content server 120 where the content may be stored in content database 122.

Multimedia environment 100 may include one or more media systems 110 and one or more content servers 120 communicatively coupled via network 140. In various embodiments, network 140 may include, without limitation, wired and/or wireless intranet, extranet, Internet, cellular, Bluetooth and/or any other short range, long range, local, regional, global communications network, as well as any combination thereof.

In an embodiment, media system 110 includes a display device 112, media device 114, remote control 116, and audiovisual (A/V) device 118. Although only a single device representing each of display device 112, media device 114, remote control 116, and A/V device 118 is illustrated within media system 110, a person of ordinary skill in the art would understand that media system 110 may comprise more than one of these devices.

Display device 112 may be implemented as, for example, a monitor, television, computer, smart phone, tablet, and/or projector. Display device 112 may support 4K or 4K HDR, for example. Display device 112 may include any number of ports for receiving video and audio content. Depending on the type and/or age of display device 112, these ports may be implemented as different HDMI ports such as an HDMI 1.4 port, an HDMI 2.0 port, HDMI Audio Return Channel (ARC) port, an HDML Mobile High-Definition Link port, or an HDML Digital Video In (DVI) port, to name just a few examples.

Media device 114 may be implemented as, for example, a streaming media device, DVD device, audio/video playback device, cable box, video game consoles, Blu-ray disc players, and/or digital video recording device. Media device 114 may include any number of ports for outputting video content. Depending on the type and/or age of media device 114, these ports may also be implemented as different HDMI ports as described above with regard to display device 112. In some embodiments, the media device 114 can be a part of, integrated with, operatively coupled to, and/or connected to display device 112. The media device 114 may be configured to communicate with network 140.

In an embodiment, A/V device 118 may be implemented within media system 110 for connecting display device 112 and media device 114. In an embodiment, more than one media device may be included in media system 110, and A/V device 118 may serve as a hub for receiving audio and video signals from multiple sources within media system 110. For example, A/V device 118 may be connected to display device 112 and the media device 114 within media system 110.

Interaction with media device 114 may be via remote control 116. Remote control 116 can be any component, part, apparatus or method for controlling media device 114, display device 112, and/or A/V device 118, such as a remote control, a tablet, laptop computer, smartphone, on-screen controls, integrated control buttons, or any combination thereof.

As will be discussed in more detail with respect to FIG. 2, a playback device 200, which may be implemented as any combination of media device 114, display device 112, and/or A/V device 118, may include components for analyzing metadata associated with content to be played at the playback device 200. In an embodiment, the metadata includes settings metadata associated with the settings of the playback device 200 and/or content metadata associated with the content to be played on the playback device 200. For example, settings metadata includes information regarding current settings, such as a current volume setting or current system activity, of the playback device 200 in media system 110 such as display device 112, media device 114, and/or A/V device 118.

In an embodiment, the current volume setting is associated with a volume setting that is received as input from a user operating the playback device 200. The input may be received directly through an interaction with the playback device 200 or from remote control 116. Current volume setting may be contrasted with the audio levels of the content in one respect: the current volume setting is a setting established by a user of the playback device 200 and is not dependent on the changes in audio level of the audio signal which could lead to the "pumping" effect described above. In another embodiment, the current system activity is a type of activity currently being performed by the playback device 200 such as playing music content, watching video content, browsing web content, and/or playing game content.

Content metadata includes information about the content such as content type (video, audio, gaming, etc.) and audio type (classical audio, heavy metal, ambient, pop, electronic, etc). In an embodiment, content metadata is known by the playback device 200 prior to playback and may be pre-processed prior to playing the content in order to optimize the voltage control capabilities of devices in media system 110.

Content server(s) 120 may include content database 122 to store content such as video content (having audio) and/or audio content. Content may include any combination of music, videos, movies, TV programs, multimedia content, productivity applications, browsing applications, gaming applications, advertisements, software, and/or any other content or data objects in electronic form.

Control server(s) 130 may include preprocessor 132 for performing the pre-processing of metadata in addition to or independent of media system 110. In an embodiment, control server(s) 130 receives metadata of content to be played at media system 110 and processes the metadata for generating voltage control information and/or a voltage control signal that is provided to the playback device 200 for adjusting the voltage of an amplifier in the playback device 200. In another embodiment, control server(s) 130 generates voltage control information which includes instructions for generating the voltage control signal, and transmits the voltage control information to the playback device 200 for generating the voltage control signal. In an embodiment, control server(s) 130 retrieves metadata locally based on information transmitted from media system(2) 110 and utilizes locally retrieved metadata.

Figure 2:
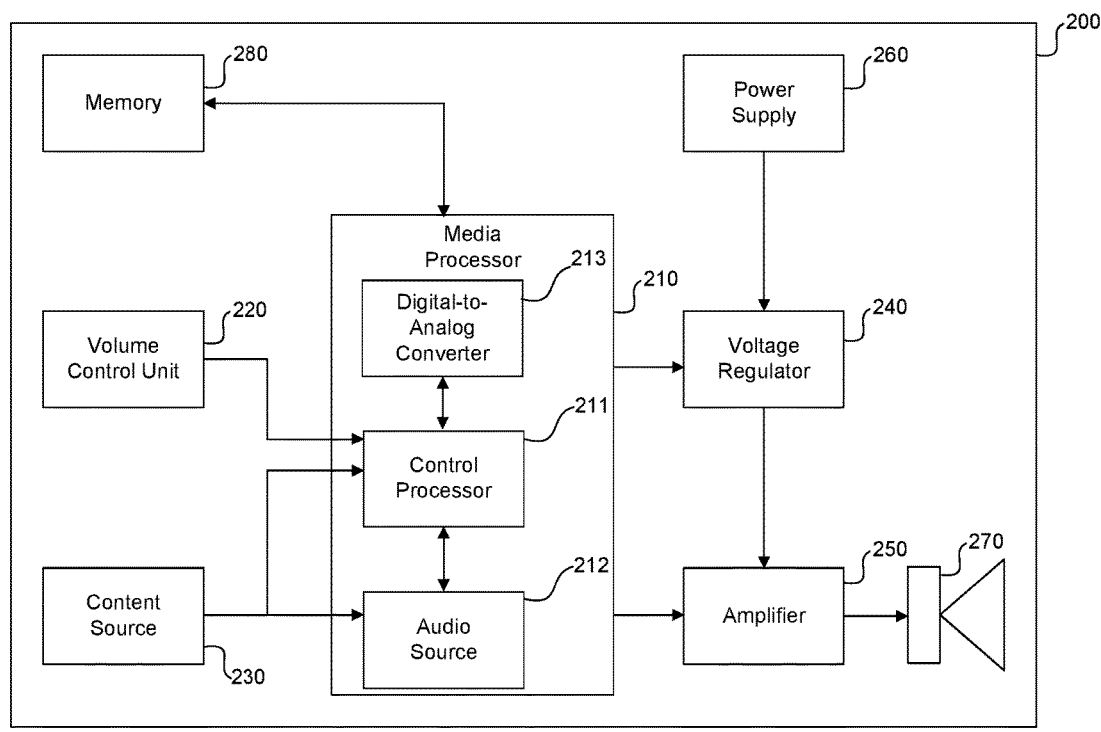
FIG. 2 illustrates a block diagram of a playback device, according to some embodiments.

FIG. 2 illustrates a block diagram of a playback device 200, according to some embodiments. In an embodiment, playback device 200 may include media processor 210, volume control unit 220, content source 230, voltage regulator 240, amplifier 250, power supply 260, speaker 270, and memory 280. The following discussion of playback device 200 will refer to devices of FIG. 1 as an exemplary non-limiting embodiment of playback device.

In an embodiment, playback device 200 is implemented by at least one of display device 112, media device 114, and A/V device 118 of media system 110 as described with respect to FIG. 1. In another embodiment, playback device 200 is implemented as some combination of display device 112, media device 114, and A/V device 118.

Referring to FIGS. 1 and 2, in some embodiments, remote control 116 transmits commands (or instructions) to playback device 200 (e.g., display device 112, media device 114, and/or A/V device 118) for controlling playback settings of content through playback device 200. In another embodiment, playback device 200 receives the commands directly from an interface (not shown) such as button or touch inputs located on the exterior of playback device 200. The commands may be associated with controlling playback settings for content having audio information to be output by playback device 200. The content may include a movie, TV show, music, book, application, and a game, to name just a few examples.

Media processor 210 may include control processor 211, audio source 212, and digital-to-analog converter 213. In an embodiment, media processor 210 is responsible for generating a voltage control signal for the purpose of regulating the amount of voltage that is utilized by amplifier 250. As noted above, in an embodiment, amplifier 250 is a class-D amplifier. Components of media processor 210 that contribute to generating the voltage control signal include control processor 211, audio source 212, and digital-to-analog converter 213.

The voltage control signal may be generated based on metadata associated with playback device 200, such as settings metadata, and with the content to be output by amplifier 250, such as content metadata. Control processor 211 may receive settings metadata from other components in playback device 200. Settings metadata may include volume setting information from volume control unit 220. Volume setting information may be a current volume value of playback device 200. In an embodiment, referring back to FIG. 1, volume control unit 220 receives volume control commands from remote control 116 such as commands increasing or decreasing the volume setting of playback device 200. In an embodiment, volume control unit 220 receives volume settings from another device in media system 110, and the voltage control signal generated by media processor 210 may be transmitted from playback device 200 to a voltage regulator located in the other device in media system 110.

Another example of settings metadata includes information about current system activity of playback device 200 such as whether playback device 200 is playing video or audio content from a local source, streaming video or audio content from a remote source over a network, a browser displaying content from a website, and/or executing an application such as a game.

Control processor 211 may receive content metadata from other components in playback device 200 such as content source 230. In an embodiment, content metadata may include information regarding the content to be played but, in some embodiments, does not include the audio signal itself as is utilized in other approaches described above. Content metadata may include, but is not limited to, the type of content to be played (e.g., video, audio, application) and the genre of the content (e.g., video—horror, action, romantic comedy, audio—pop, classical, heavy metal, rap, application—browser, game).

In an embodiment, control processor 211 implements a voltage control algorithm that takes as input the metadata (e.g., settings metadata, content metadata) and generates the voltage control signal based on the metadata. The voltage control signal can be provided by media processor 210 to voltage regulator 240 which utilizes the voltage signal to control the voltage provided to amplifier 250. In an embodiment, the voltage control signal is generated based on the settings metadata the voltage control algorithm generates.

In an embodiment, the voltage control signal may be generated before the content is output by amplifier 250 and stored (or otherwise associated) with the content so that the voltage signal does not need to be generated again. The metadata and generated voltage control signal associated with content when it is first output by amplifier 250 may be stored in memory 280. When the same content is played again (e.g., on repeat), media processor 210 may retrieve the generated voltage control signal and provide the signal to voltage regulator 240. As a non-limiting example, playback device 200 may store the volume setting information associated with playback of the content including whether the volume setting was changed during a particular moment of playback. In other words, the volume setting information represents the volume setting of playback device 200 throughout the playback of the content. Accordingly, the generated voltage control signal may then regulate voltage provided to amplifier 250 throughout the playback of the content.

In an embodiment, playback device 200 generates a voltage profile associated with different content. The voltage profile can store metadata associated with the content, and the generated voltage control signals associated with each playback of the content. For example, if the content is a music file, the music file's voltage profile may include the generated voltage control signal each time the music file has been played on playback device 200 (output through amplifier 250). Any changes to the metadata that occur during subsequent playback of the content may be used to update the content's voltage profile, including the voltage control signal.

In another embodiment, the voltage control signal may be generated dynamically upon each playback of the content based on the metadata as described above. In an embodiment, the voltage control signal is generated based on content metadata, which is known prior to playback, and settings metadata, which may be updated during playback of the content (e.g., volume setting of playback device 200). In general, metadata does not change as quickly as the audio level of the content and therefore, the voltage control signal generated based on the metadata provides smoother regulation of the voltage provided to amplifier 250 and avoids the "pumping" effect that is prevalent in prior art solutions as described above.

Audio source 212 is a component that retrieves audio information of content to be played and provides the audio information to amplifier 250 for output through speaker 270.

In an embodiment, playback device 200 includes digital-to-analog converter 213. In another embodiment, to save costs or for any other reason, playback device 200 does not include digital-to-analog converter 213. When implemented in playback device 200, digital-to-analog converter 213 provides increased granularity for voltage control. In this embodiment, control processor 211 generates a voltage control signal on a linear scale (e.g., from a minimum to a maximum amount of voltage). If playback device 200 does not include digital-to-analog converter 213, it may provide less granular control over the voltage but result in lower cost. In this embodiment, control processor 211 generates a voltage control signal having a number of discrete levels (e.g., low, medium, high) with regard to the amount of voltage that is provided to amplifier 250.

As discussed above, volume control unit 220 provides volume setting information to media processor 210. In an embodiment, volume setting information represents the current volume setting of playback device 200 and generally does not vary as much as the audio signal of content. In another embodiment, volume control unit 220 may be implemented in another device within media system 110 but still communicate with media processor 210 of playback device 200.

Content source 230 may receive the content locally, such as from memory 280, or remotely, such as from content server(s) 120 over the network 140. Content server(s) 120 may transmit requested content to content source 230. In an embodiment, playback device 200 may play the content and output the audio from the content through amplifier 250 and speaker 270. In another embodiment, playback device 200 may transmit the content to another device within media system 110. For example, if playback device 200 is implemented as media device 114, playback device 200 may transmit content to display device 112 and A/V device 118.

As discussed above, voltage regulator 240 regulates voltage from power supply 260 based on the voltage control signal received from media processor 210.

As noted above, amplifier 250 receives a voltage from voltage regulator 240 and audio information to be output through speaker 270 from media processor 210. In an embodiment, amplifier 250 is a class-D amplifier.

Power supply 260, internal to playback device 200, generates and outputs an internal power voltage to voltage regulator 240. In some embodiments, power supply 260 may be external to playback device 200.

Speaker 270 may be implemented within playback device 200, as a separate device external to playback device 200, or as a component within another device within media system 110. Speaker 270 receives the audio output from amplifier 250.

In some embodiments, memory 280 may store code or control logic that, when executed, causes media processor 210 to generate voltage control instructions based on metadata associated with playback device 200 (e.g., settings metadata) and the content (e.g., content metadata). In an embodiment, playback device 200 may be external to display device 112 and connected to a port of display device 112 by, for example, a physical cable or a wireless connection. In another embodiment, media device 114 may be a component of display device 112 and is connected to other components of display device 112 by, for example, a physical bus. In another embodiment, media device 114 may be a component of A/V device 118 and is connected to other components of A/V device 118 by, for example, a physical bus.

Figure 3:
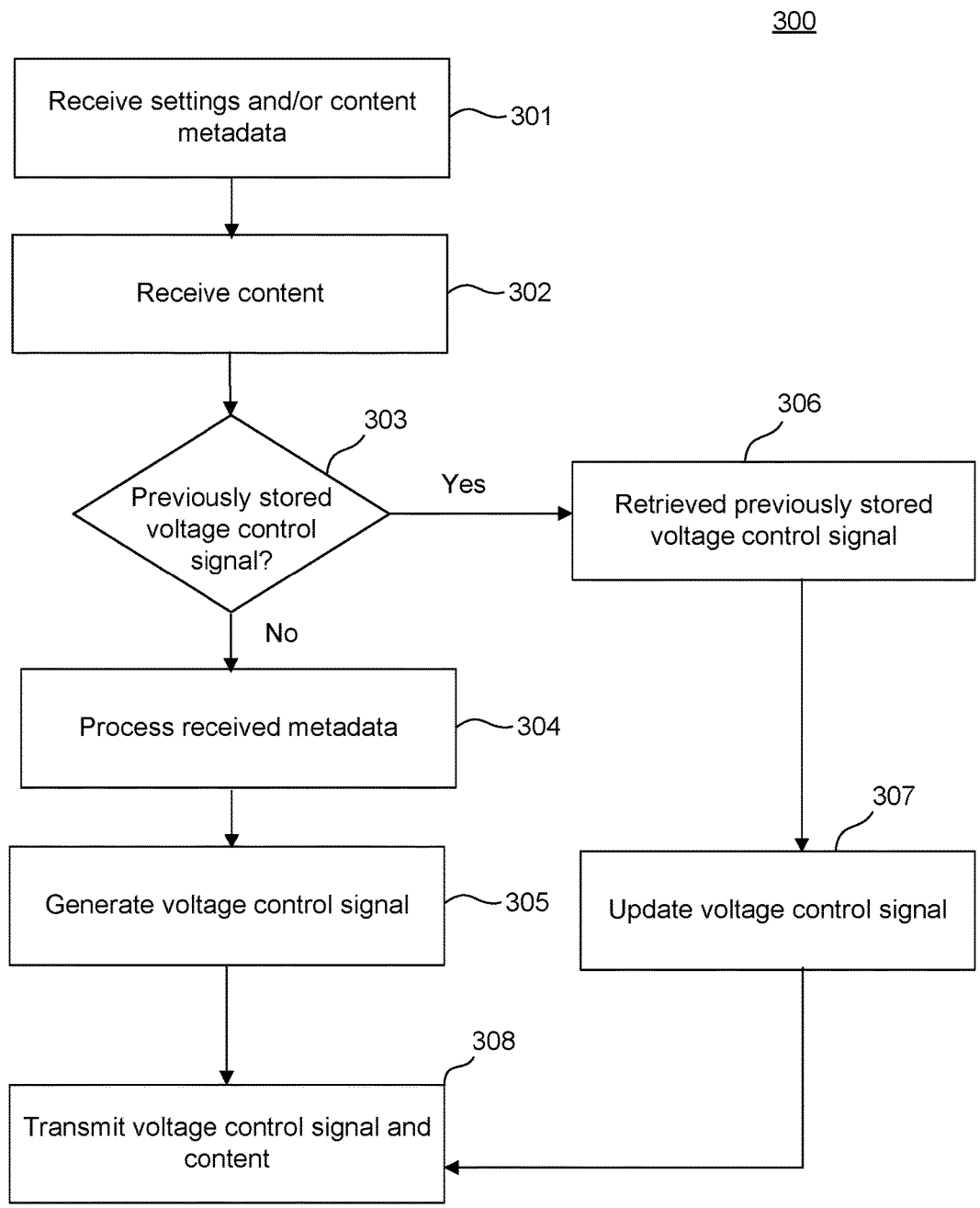
FIG. 3 is a flowchart for generating a voltage control signal, according to some embodiments.

FIG. 3 is a flowchart for generating a voltage control signal according to some embodiments. As a non-limiting example with regard to FIG. 2, the steps of method 300 shown in FIG. 3 may be performed by playback device 200 to generate a voltage control signal for controlling voltage of playback device 200. In such an embodiment, playback device 200 may execute code in memory 280 to perform method 300 of FIG. 3. While method 300 of FIG. 3 will be discussed below as being performed by playback device 200, other devices including control server 130 may store the code and therefore may execute method 300 by directly executing the code. For example, in some embodiments, an external server, such as content server(s) 120 and/or control server 130, may store code for executing method 300. The following discussion of method 300 will refer to devices of FIGS. 1 and 2 as an exemplary non-limiting embodiment of method 300.

In step 301, media processor 210 receives settings and/or content metadata. Media processor 210 may utilize settings metadata and content metadata individually or in combination with each other to generate a voltage control signal. In an embodiment, settings metadata is received from a different source than content metadata. For example, settings metadata may be received from volume control unit 220 and/or memory 280 and content metadata may be received from content source and/or memory 280. Volume control unit 220 may provide settings metadata in real-time as the metadata changes while the content is being played by playback device 200. For example, volume control unit 220 may provide volume settings information to media processor 210 as the volume of playback device 200 is updated (e.g., when a user changes the volume during playback of content).

In another embodiment, settings and/or content metadata may be received from the same source. In an embodiment, settings and/or content metadata is received from memory 280 when the content has been previously played at playback device 200 and/or the metadata associated with the content has been already cached.

In step 302, media processor 210 receives content to be output through amplifier 250. Content may be video, music, or an application with sound, to name just a few examples. In an embodiment, settings metadata and content metadata may be received after or concurrently with content to be played by playback device 200.

In step 303, media processor 210 determines whether a voltage control signal has been previously generated for the content to be played on playback device 200 (i.e., output by speaker 270). In an embodiment, media processor 210 performs this determination by querying memory 280 using a content identifier associated with the content to retrieve any data, such as a previously generated voltage control signal, associated with the content. This may involve comparing the content identifier of the content with an identifier that is associated with any voltage control signals that are stored in memory 280.

In step 304, if a voltage control signal has not been previously generated, then media processor 210 processes the received metadata using a voltage control algorithm implemented by control processor 211. In an embodiment, the voltage control algorithm is selected from a plurality of voltage control algorithms stored in playback device 200. Voltage control algorithm may be selected based on the metadata and/or the content to be played; there may be a specific voltage control algorithm associated with the metadata and/or the content to be played. For example, there may be different voltage control algorithms for different types of content such as a voltage control algorithm for video content and a different voltage control algorithm for audio content. In an embodiment, output of the voltage control algorithm is voltage control information such as a desired voltage to be output by voltage regulator 240. In another embodiment, voltage control information may represent a desired voltage range.

The received metadata is provided as input to the voltage control algorithm. In an embodiment, the received metadata includes volume setting information of playback device 200 where the volume setting information has a value that is configured by a user of playback device 200 through, for example, remote control 116 or through directly interacting with playback device 200 (such as through button or touch input). For example, the voltage control algorithm may establish a direct relationship between the volume setting information and the voltage control signal where a lower volume value may result in a voltage control signal that lowers the voltage provided to amplifier 250. As noted above, depending on the implementation of media processor 210 (e.g., number of pins, implementation of a digital-to-analog converter within media processor 210), the voltage control algorithm may have different levels of granularity.

In one embodiment, the voltage control algorithm generates a voltage control signal that results in discrete levels of voltage such as low, medium and high. In an embodiment where there are three discrete levels, a specific range of volume values (e.g., 0-4) may be associated with low voltage, another specific range may be associated with medium voltage (e.g., 5-7), and another range may be associated with high voltage (e.g., 8-10). This embodiment is merely exemplary and is not intended to limit the scope of the correspondence between the metadata and the voltage control signal. For example, additional metadata in addition or alternative to volume may be utilized.

In another embodiment, the voltage control algorithm may generate a voltage control signal that results in a linear scale of voltage and the algorithm may establish a direct one-to-one correspondence between the metadata and the voltage control signal. For example, a volume value of zero may result in zero voltage instructed by the voltage control signal.

In step 305, media processor 210 generates a voltage control signal based on the processed metadata and the voltage control algorithm.

In step 306, if a voltage control signal has been previously generated for the content as determined in step 303, then media processor 210 retrieves the stored voltage control signal, for example, from memory 280. In step 307, media processor 210 may update the retrieved voltage control signal. Updating the retrieved voltage control signal may include processing any metadata (as previously discussed in step 304) associated with the content including metadata that is received prior to playback of the content (e.g., content type) and/or metadata that is received concurrent to playback of the content (e.g., volume information, system activity).

In step 308, media processor 210 transmits the generated or updated voltage control signal to voltage regulator 240, and the content to be played to amplifier 250. In an embodiment, voltage regulator 240 and amplifier 250 may be implemented in the same device as media processor 210. In another embodiment, voltage regulator 240 and amplifier 250 may be implemented in separate devices from media processor 210. The voltage control signal may then control voltage regulator 240 by regulating the voltage provided from voltage regulator 240 to amplifier 250.

Figure 4:
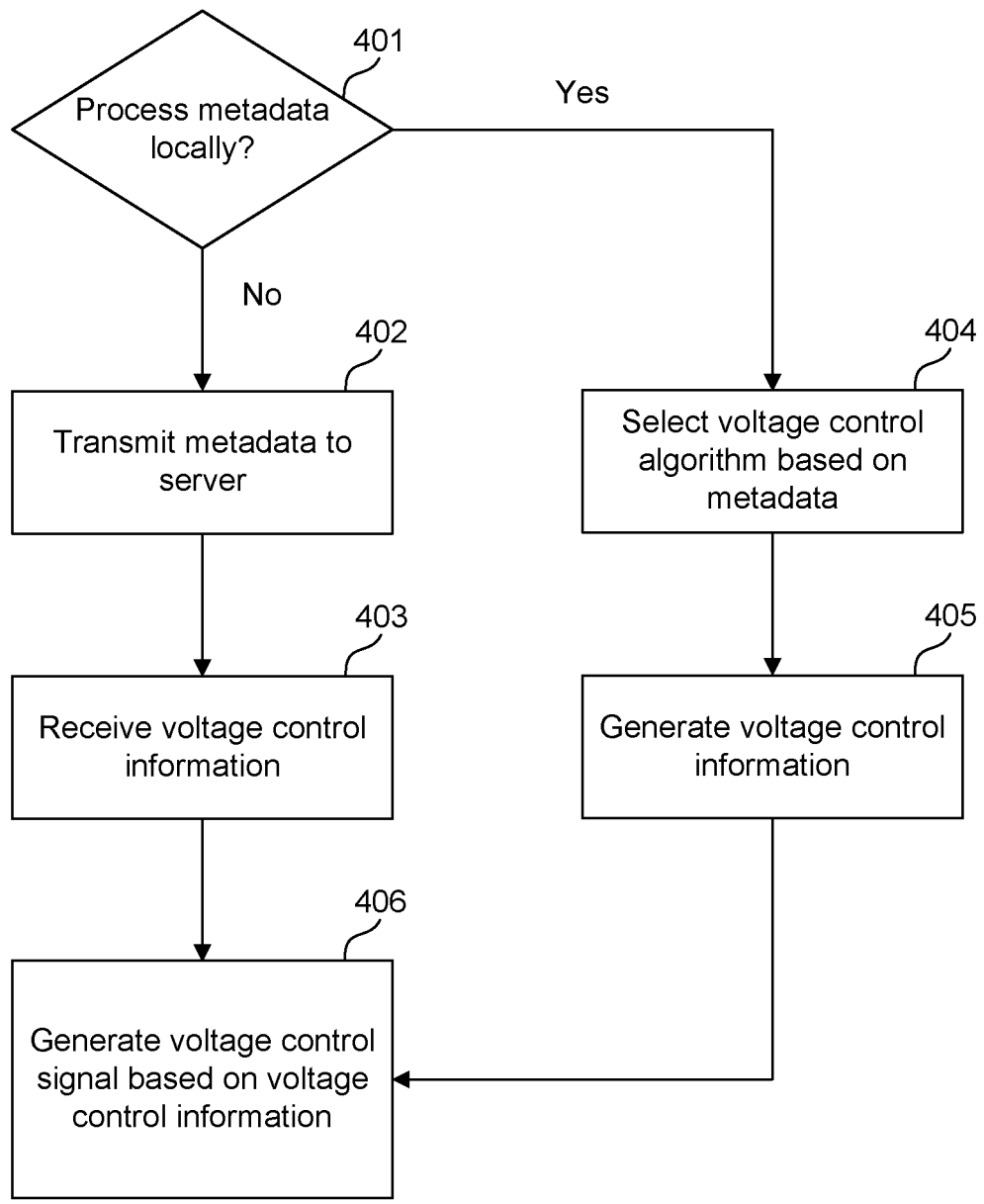
FIG. 4 is a flowchart for generating a voltage control signal in a distributed manner, according to some embodiments.

FIG. 4 is a flowchart for generating a voltage control signal in a distributed manner according to some embodiments. As a non-limiting example with regard to FIG. 2, the steps of method 400 shown in FIG. 4 may be performed by playback device 200 to generate a voltage control signal for controlling voltage of playback device 200. In such an embodiment, playback device 200 may execute code in memory 280 to perform method 400 of FIG. 4. While method 400 of FIG. 4 will be discussed below as being performed by playback device 200, other devices including control server 130 may store the code and therefore may execute method 300 by directly executing the code. For example, in some embodiments, an external server, such as content server(s) 120 and/or control server 130, may store code for executing method 400. The following discussion of method 400 will refer to devices of FIGS. 1 and 2 as an exemplary non-limiting embodiment of method 400.

In step 401, media processor 210 determines whether to process metadata locally at playback device 200. This determination may be based on the capabilities of playback device 200, code stored in memory 280 that instruct metadata to be processed locally, remotely at a server, or both, or the content that is to be played at playback device 200. For example, if content is being streamed from a remote source such as from content server 120 or control server 130, voltage control information associated with the content may be received from the remote source. In an embodiment, the voltage control information is received, at playback device 200, concurrently with the content to be played.

In step 402, if the metadata is not to be processed locally (e.g., in a distributed manner), then media processor 210 may transmit the metadata to a server such as control server 130. In an embodiment, media processor 210 may only transmit a content identifier which the server may use to retrieve the metadata from another source other than playback device 200.

In step 403, media processor 210 receives voltage control information from the server. In an embodiment, the server processes the metadata similar to what is described with respect to step 304 of FIG. 3.

In step 404, if the metadata is to be processed locally at playback device 200 as determined in step 401, then media processor 210 may select a voltage control algorithm from a plurality of voltage control algorithms. The selection may be based on the content to be played and/or the metadata.

In step 405, media processor 210 inputs the metadata to the voltage control algorithm which in turn generates voltage control information. In step 406, media processor 210 generates a voltage control signal based on the received or generated voltage control information.

Example Computer System

Figure 5:
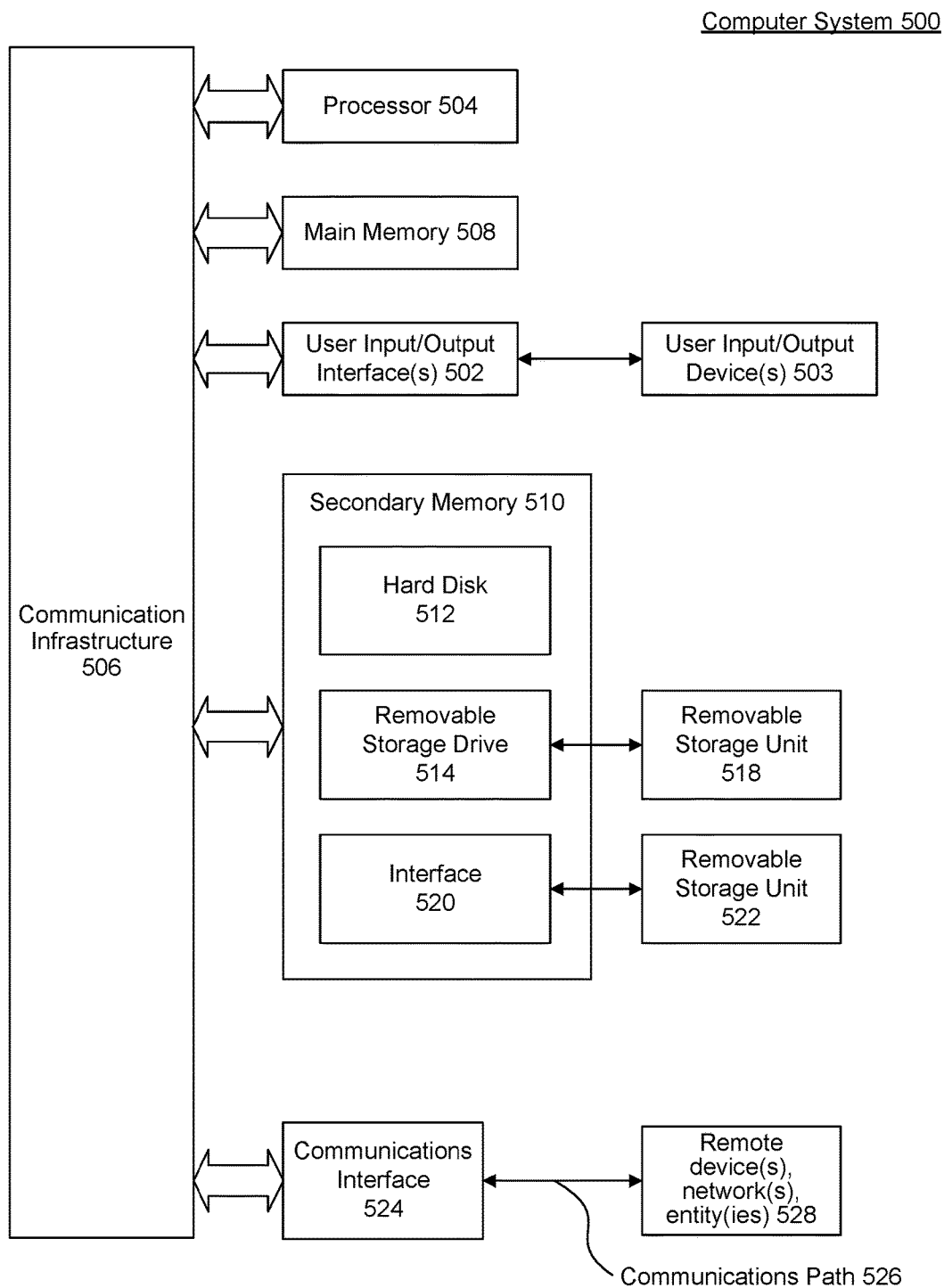
FIG. 5 illustrates an example computer system useful for implementing various embodiments.

Various embodiments and/or components therein can be implemented, for example, using one or more computer systems, such as computer system 500 shown in FIG. 5. Computer system 500 can be any computer or computing device capable of performing the functions described herein. For example, one or more computer systems 500 can be used to implement any embodiments of FIGS. 1-4, and/or any combination or sub-combination thereof.

Computer system 500 includes one or more processors (also called central processing units, or CPUs), such as a processor 504. Processor 504 is connected to a communication infrastructure or bus 506. Processor 504 may be implemented as a media processor such as described above with respect to media processor 210.

One or more processors 504 can each be a graphics processing unit (GPU). In some embodiments, a GPU is a processor that is a specialized electronic circuit designed to process mathematically intensive applications. The GPU can have a parallel structure that is efficient for parallel processing of large blocks of data, such as mathematically intensive data common to computer graphics applications, images, videos, etc.

Computer system 500 also includes user input/output device(s) 503, such as monitors, keyboards, pointing devices, etc., that communicate with communication infrastructure 506 through user input/output interface(s) 502.

Computer system 500 also includes a main or primary memory 508, such as random access memory (RAM). Main memory 508 can include one or more levels of cache. Main memory 508 has stored therein control logic (i.e., computer software) and/or data.

Computer system 500 can also include one or more secondary storage devices or memory 510. Secondary memory 510 can include, for example, a hard disk drive 512 and/or a removable storage device or drive 514. Removable storage drive 514 can be a floppy disk drive, a magnetic tape drive, a compact disk drive, an optical storage device, tape backup device, and/or any other storage device/drive.

Removable storage drive 514 can interact with a removable storage unit 518. Removable storage unit 518 includes a computer usable or readable storage device having stored thereon computer software (control logic) and/or data. Removable storage unit 518 can be a floppy disk, magnetic tape, compact disk, DVD, optical storage disk, and/any other computer data storage device. Removable storage drive 514 reads from and/or writes to removable storage unit 518 in a well-known manner.

According to an exemplary embodiment, secondary memory 510 can include other means, instrumentalities or other approaches for allowing computer programs and/or other instructions and/or data to be accessed by computer system 500. Such means, instrumentalities or other approaches can include, for example, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 500 can further include a communication or network interface 524. Communication interface 524 enables computer system 500 to communicate and interact with any combination of remote devices, remote networks, remote entities, etc. (individually and collectively referenced by reference number 528). For example, communication interface 524 can allow computer system 500 to communicate with remote devices 528 over communications path 526, which can be wired and/or wireless, and which can include any combination of LANs, WANs, the Internet, etc. Control logic and/or data can be transmitted to and from computer system 500 via communication path 526.

In some embodiments, a tangible apparatus or article of manufacture comprising a tangible computer useable or readable medium having control logic (software) stored thereon is also referred to herein as a computer program product or program storage device. This includes, but is not limited to, computer system 500, main memory 508, secondary memory 510, and removable storage units 518 and 522, as well as tangible articles of manufacture embodying any combination of the foregoing. Such control logic, when executed by one or more data processing devices (such as computer system 500), causes such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 5. In particular, embodiments can operate with software, hardware, and/or operating system implementations other than those described herein.

CONCLUSION

It is to be appreciated that the Detailed Description section, and not the Summary and Abstract sections, is intended to be used to interpret the claims. The Summary and Abstract sections can set forth one or more but not all exemplary embodiments as contemplated by the inventors, and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. A playback device, comprising:
   an amplifier;
   a voltage regulator electrically coupled with the amplifier;
   a volume control unit configured to receive settings metadata associated with a volume setting of the playback device;
   a digital-to-analog converter configured to convert a digital voltage control signal into an analog voltage signal;
   a content source configured to provide content metadata associated with content to be output by the amplifier; and
   a media processor configured to:
   receive the settings metadata and the content metadata;
   generate, based on the settings metadata and the content metadata, a digital voltage control signal;
   transmit the digital voltage control signal to the digital-to-analog converter for conversion into the analog voltage control signal;
   receive the analog voltage control signal from the digital-to-analog converter; and
   transmit the analog voltage control signal to the voltage regulator.

2. The playback device of claim 1, wherein the amplifier is a Class-D amplifier.

3. The playback device of claim 1, wherein the volume setting is configurable by a user of the playback device and represents a current volume level of the playback device.

4. The playback device of claim 1, wherein the content is audio content and the content metadata comprises an audio type of the audio content.

5. The playback device of claim 1, wherein the content metadata identifies a content type of the content.

6. The playback device of claim 1, wherein the voltage regulator is configured to:
receive, from the media processor, the analog voltage control signal; and
adjust, based on the analog voltage control signal, a voltage level that is provided to the amplifier.

7. The playback device of claim 1, wherein the media processor is further configured to:
process the settings metadata and the content metadata based on a voltage control algorithm, wherein the digital voltage control signal is generated based on the processing of the settings metadata and the content data.

8. The playback device of claim 7, wherein the voltage control algorithm is selected, based on the content metadata, from a plurality of voltage control algorithms.

9. A method for reducing power consumption of an amplifier in a playback device, comprising:
receiving, by a volume control unit of the playback device, settings metadata associated with a volume setting of the playback device;
receiving, by a media processor of the playback device, the settings metadata from the volume control unit and content metadata from a content source, wherein the content metadata is associated with content to be output by the amplifier;
generating, based on the settings metadata and the content metadata, a digital voltage control signal;
transmitting the digital voltage control signal to a digital-to-analog converter;
receiving an analog voltage control signal from the digital-to-analog converter;
transmitting the analog voltage control signal to a voltage regulator; and
adjusting, based on the analog voltage control signal, a voltage level that is provided to the amplifier.

10. The method of claim 9, wherein the amplifier is a Class-D amplifier.

11. The method of claim 9, wherein the volume setting is configurable by a user of the playback device and represents a current volume level of the playback device.

12. The method of claim 9, wherein the content is audio content and the content metadata identifies an audio type of the audio content.

13. The method of claim 9, wherein the content metadata comprises a content type of the content.

14. The method of claim 9, further comprising:
processing the settings metadata and the content metadata based on a voltage control algorithm, wherein the digital voltage control signal is generated based on the processing of the settings metadata and the content metadata, and the voltage control algorithm is selected, based on the content metadata, from a plurality of voltage control algorithms.

15. A non-transitory, tangible computer-readable device having instructions stored thereon that, when executed by a playback device, cause the playback device to perform operations comprising:
receiving, by a volume control unit of the playback device, settings metadata associated with a volume setting of the playback device;
receiving, by a media processor of the playback device, the settings metadata from the volume control unit and content metadata from a content source, wherein the content metadata is associated with content to be output by an amplifier of the playback device;
generating, based on the settings metadata and the content metadata, a digital voltage control signal;
transmitting the digital voltage control signal to a digital-to-analog converter;
receiving an analog voltage control signal from the digital-to-analog converter;
transmitting the analog voltage control signal to a voltage regulator; and
adjusting, based on the analog voltage control signal, a voltage level that is provided to the amplifier.

16. The non-transitory, tangible computer-readable device of claim 15, wherein the amplifier is a Class-D amplifier.

17. The non-transitory, tangible computer-readable device of claim 15, wherein the volume setting is configurable by a user of the playback device and represents a current volume level of the playback device.

18. The non-transitory, tangible computer-readable device of claim 15, wherein the content is audio content and the content metadata identifies an audio type of the audio content.

* * * * *